(12) United States Patent
Zeiger

(10) Patent No.: US 6,307,371 B1
(45) Date of Patent: Oct. 23, 2001

(54) PROBEHEAD FOR NUCLEAR MAGNETIC RESONANCE MEASUREMENTS

(75) Inventor: Heinz Zeiger, Waldbronn (DE)

(73) Assignee: Bruker Analytik GmbH (DE)

( * ) Notice: Subject to any disclaimer, the term of this patent is extended or adjusted under 35 U.S.C. 154(b) by 0 days.

(21) Appl. No.: 09/577,690

(22) Filed: May 22, 2000

(30) Foreign Application Priority Data

May 21, 1999 (DE) ............................................. 199 23 294

(51) Int. Cl.[7] ....................................................... G01V 3/00
(52) U.S. Cl. ............................................ 324/318; 324/322
(58) Field of Search ........................................ 324/318, 322, 324/300, 307, 309, 306, 314; 600/422, 421, 410

(56) References Cited

U.S. PATENT DOCUMENTS

| 5,107,217 | * | 4/1992 | Duerr | 324/322 |
| 5,229,724 | | 7/1993 | Zeiger | 324/322 |
| 5,243,289 | * | 9/1993 | Blum et al. | 324/322 |
| 5,424,645 | * | 6/1995 | Doty | 324/318 |
| 5,675,254 | * | 10/1997 | Fiat et al. | 324/318 |
| 5,861,748 | | 6/1999 | Schaefer et al. | 324/318 |

OTHER PUBLICATIONS

Schnall, M.D., et al., "The Application of Overcoupled Tank Circuits to NMR Probe Design", *Journal of Magnetic Resonance* 67, 129–134 (1896).

Chang, L.-H., et al., "A Balanced–Matched Double-Tuned Probe for in Vivo[1] H and $^{31}$P NMR", *Journal of Magnetic Resonance* 72, 168–172 (1987).

Fitzsimmons, J.R., et al., "A Comparison of Double–Tuned Surface Coils", *Magnetic Resonance in Medicine* 10, 302–309 (1989).

Hasse, J., et al., "Double Resonance Probes for Close Frequencies", *Journal of Magentic Resonance* 135, 273–279 (1998), Article No. MN981579.

Rindlisbacher, Martin, Bruker Instruments, Inc., Instruction Manual for: HFX–Unit, 200 MHz: B1507, 300 MHz: B1449, 400 MHz: B1456, 500 MYHz: B1506, Version 3, Apr. 10, 1997.

* cited by examiner

*Primary Examiner*—Louis Arana
(74) *Attorney, Agent, or Firm*—Oppenheimer Wolff & Donnelly LLP; Claude A. S. Hamrick

(57) ABSTRACT

A probehead for nuclear magnetic resonance measurements is disclosed. At least a first and a second distinct kind nuclei are excited in a magnetic field. The probehead comprises a measuring coil cooperating with a sample. The coil is connected to a first terminal for feeding a signal of a first frequency for exciting the first kind of nuclei and/or for receiving a resonance signal emitted by nuclei of the first kind of nuclei, and to a second terminal for feeding a signal of a second frequency for exciting the second kind of nuclei and/or for receiving a resonance signal emitted by nuclei of the second kind of nuclei. A radio frequency transmission line of predetermined length is connected to the measuring coil. The transmission line is bridged at about half of its length by a resonance element. The coupling between the measuring coil, the radio frequency transmission line and the resonance element is set to be overcritical, such that a transmission characteristic of the measuring coil has two maxima with frequencies corresponding to the first and to the second frequency.

21 Claims, 3 Drawing Sheets

PROBEHEAD FOR NUCLEAR MAGNETIC RESONANCE MEASUREMENTS

FIELD OF THE INVENTION

The present invention relates to the field of magnetic resonance. More specifically, the invention relates to the field of nuclear magnetic resonance.

Still more specifically, the invention is concerned with a probehead for nuclear magnetic resonance measurements in which at least a first and a second distinct kind of nuclei are excited in a magnetic field of high homogeneity.

BACKGROUND OF THE INVENTION

A probehead intended to be used for nuclear magnetic resonance measurements in which at least a first and a second distinct kind of nuclear are excited in a homogeneous magnetic field is, for example, disclosed in U.S. Pat. No. 5,229,724 of the same assignee as the present application. This prior art probehead is intended to be used for measurements where the distinct kind of nuclei have highly different resonance frequencies. For example, the first kind of nuclei may be $^1$H (protons) having a measuring frequency of 400 MHz when the strength of the homogeneous magnetic field is set to be 9,4 T. The second kind of nuclei, normally referred to as "X" may, for example, be $^{13}$C having a measuring frequency of 100,577 MHz or $^{15}$N having a measuring frequency of 40,531 MHz or $^{31}$P having a measuring frequency of 161,923 MHz.

In order to be able to operate the probehead at these highly different measuring frequencies, distinguishing from each other by at least a factor of two, a radio frequency transmission line configurating an integral component of the probehead, is provided with a switch at half length of the transmission line. The length of the radio frequency transmission line corresponds, for example, to $\lambda/2$, i.e. half the wavelength of the higher frequency ($^1$H).

The so-called X-frequency, i.e. the measuring frequency of the second kind of nuclei may, for certain kinds of nuclei ($^{15}$N) be of about one order of magnitude smaller as compared to the measuring frequency of the first kind of nuclei ($^1$H). In other cases ($^{31}$P) it may, however, be of the same order of magnitude as the measuring frequency of the first kind of nuclei. In order to be able to measure the first kind of nuclei as well as the other, the X-kind of nuclei, the switch may be operated accordingly.

It is, further, well-known in the art to perform nuclear magnetic resonance measurements on at least two distinct kinds of nuclei having a measuring frequency that distinguishes only slightly, in particular by only several percents. Examples for such pairs of kinds of nuclei are $^1$H having a measuring frequency of 400 MHz and $^{19}$F having a measuring frequency of 376,308 MHz, or, as another example, $^{31}$P having a measuring frequency of 161,923 together with $^7$Li having a measuring frequency of 150,454 MHz or, as still another example, $^{23}$Na having a measuring frequency of 105,805 MHz together with $^{13}$C having a measuring frequency of 100,577 MHz, all of the aforementioned frequency values being given relative to a magnetic field strength of 9,4 T.

In an article published in "Journal of Magnetic Resonance", 67, pp. 129–134 (1986), fields of applications are disclosed in which overcritically coupled resonance circuits utilizing discrete components are used. With an overcritical coupling of two resonance circuits, a transmission characteristic is generated, as known per se, having two maxima. In the aforementioned article these maxima are disclosed to be set such that they correspond to the neighbored measuring frequencies of the two kinds of nuclei.

This prior art probehead, however, is suited solely for relatively low frequencies and, due to the discrete components used, cannot be operated within modern spectrometers having a high measuring frequency. Another disadvantage of this prior art probehead resides in the fact that the tuning and the matching of concentrated, discrete components must be effected for both frequencies in the direct vicinity of the measuring coil. This is of particular disadvantage for temperature-controlled measurements because in that case only a very limited space is available.

Further probeheads of the aforementioned kind are disclosed in "Journal of Magnetic Resonance," 72, pp. 168–172 (1987), "Magnetic Resonance in Medicine," 12, pp. 302–309 (1989) and "Journal of Magnetic Resonance", 135, pp. 273–279 (1989).

In a company brochure "BRUKER Instruction Manual for HFX-Unit", Apr. 10$^{th,}$ 1997, p. 22, still another probehead for nuclear magnetic resonance measurements on two distinct kinds of nuclei having almost the same measuring frequencies, is disclosed. In this prior art probehead, the measuring coil is also connected to a radio frequency transmission line of predetermined length. This system is tuned to the center frequency between the two nuclear magnetic resonance measuring frequencies. At a location somewhat outside half the length of the radio frequency transmission line, a piece of coaxial transmission line of appropriate length is capacitively coupled. By doing so, the center frequency is split. The efficiency of the probehead being tuned to that center frequency, is, however, deteriorated because the energy that is fed to the probehead will be distributed on the two frequencies as well as on a further, still more distant frequency.

Finally, U.S. Pat. No. 5,861,748 discloses still another probehead being described to enable measurements on a plurality of nuclear magnetic resonance measuring frequencies of distinct kinds of nuclei. This prior art probehead consists of a highly branched assembly of coaxial transmission lines of different lengths and different branch points having each distinct matching elements for the various measuring frequencies. This coaxial transmission line assembly of the prior art probehead is disadvantageous because for any change from the one to another kind of nuclei a change to another piece of coaxial transmission line has to be effected for the prevailing lower operational frequency. Moreover, it is highly unlikely that the disclosed coaxial transmission line assembly may be housed in an elongate probehead of small diameter.

It is, therefore, an object underlying the invention to improve a probehead of the kind specified at the outset such that the aforementioned disadvantages are avoided.

In particular, it shall be possible to conduct nuclear magnetic resonance measurements on at least two distinct kinds of nuclei and having highly similar measuring frequencies. In particular, this shall become possible while simultaneously or alternately irradiating and/or observing signals for other kinds of nuclei of a different measuring frequency. The efficiency of the probehead as a whole shall be better than that of prior art assemblies.

SUMMARY OF THE INVENTION

According to a probehead specified at the outset, this object is achieved when the probehead comprises:

a) a measuring coil cooperating with a sample and being connected to a first terminal for feeding a signal of a first frequency for exciting the first kind of nuclei and/or for receiving a resonance signal emitted by nuclei of the first kind of nuclei; and a second terminal for feeding a signal of a second frequency for exciting the second kind of nuclei and/or for receiving a resonance signal emitted by nuclei of the second kind of nuclei;

b) a radio frequency transmission line of predetermined length connected to the measuring coil, the transmission line being bridged at about half of its length by a resonance element, wherein the coupling between the measuring coil, the radio frequency transmission line and the resonance element is set to be overcritical, such that a transmission characteristic of the measuring coil has two maxima with frequencies corresponding to the first and to the second frequency.

The invention, therefore, takes advantage of a feature, known per se, namely to generate a transmission characteristic with two distinct maxima by overcritically coupling, the frequency position of the maxima corresponding to the frequencies of the two kinds of nuclei. However, the invention is not at all limited to this feature but reduces that feature to practice in that without utilizing discrete components in the vicinity of the measuring coil, a resonance element is located at about half the length of the radio frequency transmission line, i.e. a voltage node of the signal being at the measuring frequency. By doing so, the same effect is obtained, for example when measuring protons ($^{1}$H). As a decisive further advantage, the probehead efficiency is just improved because almost the entire input signal power is distributed onto the two maxima of the transmission characteristics because no other maxima at far away frequencies exist as is the case in the prior art.

Due to these measures it is, further, possible to provide the probehead with a so-called distant feed, i.e. to locate the feed point or input of the probehead on that side of the probehead being opposite to the measuring coil. The same holds true in view of a distant tuning and a distant matching, for what concerns the location and the actuation of tuning and matching elements. These features have the distinct advantage that a particularly slim design of the probehead is enabled so that a probehead according to the present invention may be utilized with many advantages in high field spectrometers of modern design. This holds true in particular when, additionally, a temperature control for the sample is provided.

Due to these properties, the probehead according to the invention is particularly suited for so-called MAS (Magic Angle Spinning) experiments, i.e. measurements in which the sample under investigation is tilted by the so-called "magic angle" relative to the main axis of the magnetic field and is then rotated about this tilted axis at high rotational speed. Due to the position of the aforementioned element at considerable distance from the measuring coil, the negative influence of these elements on the homogeneity of the magnetic field is minimized, thus enabling particularly high resolution measurements.

As already mentioned, the invention is particularly suited for such cases in which the first and the second measuring frequency distinguished by less than 10%. This is, for example, the case for the following pairs of kinds of nuclei: $^{1}$H and $^{19}$F, $^{31}$P and $^{7}$Li, as well as $^{23}$Na and $^{13}$C.

It is particularly preferred when the resonance element is configured as an adjustable inductor. The high frequency transmission line is, preferably, configured as a coaxial line having an inner conductor and an outer conductor, the resonance element interconnecting the inner conductor and the outer conductor.

In a first group of embodiments of the present invention, the measuring coil is connected to a first end of the radio frequency transmission line, the first and the second terminals being positioned at a second end of the radio frequency transmission line opposite the first end.

As mentioned above, this measure has the advantage to use a distant feed, a distant tuning and a distant matching, i.e. to arrange all necessary elements at considerable distance from the measuring coil.

However, also other cases of application might be contemplated in which the measuring coil is connected to an end of the radio frequency transmission line, the first and the second terminals being then positioned at the same end of the radio frequency transmission line.

In both groups of embodiments, mentioned before, the terminals may be capacitively connected to the radio frequency transmission line.

This may be effected preferably by connecting the terminals to the radio frequency transmission line via a capacitive voltage divider.

In a preferred variation of this embodiment, the capacitive voltage divider comprises a tuning capacitor arranged between the radio frequency transmission line and ground, a coupling capacitor extending from an electrode of the tuning capacitor opposite ground, and a matching capacitor connecting the coupling capacitor and ground, the terminals being connected to a node between the coupling capacitor and the matching capacitor.

This measure has the advantage that for intentionally adjusting one or more of the frequencies, a predetermined sequence of tuning and matching to the two frequencies is possible, preferably in combination with an adjustment of the size of the resonance or coupling element, respectively, about at half length of the radio frequency transmission line.

In a third group of embodiments, the measuring coil is connected to an end of the radio frequency transmission line, the terminals being positioned at one half of the length. In that case, the terminals are preferably inductively connected to the radio frequency transmission line.

Moreover, according to the invention, one may connect the measuring coil, further, to still another terminal for feeding a signal of a third frequency for exciting a third kind of nuclei and/or for receiving signals emitted from nuclei of the third kind of nuclei.

This measure is of particular advantage in connection with so-called X-frequencies, i.e. in cases in which the third frequency distinguishes from the first and from the second frequency by at least a factor of two.

In this case it is advisable to position the other terminal at an electrode of the measuring coil opposite the radio frequency line.

Further advantages of the invention will become apparent from the description and the enclosed drawing.

It goes without saying that the features mentioned before and those that will be explained hereinafter, may not only be used in the particularly given combination but also in other combinations or alone, without leaving the scope of the present invention.

BRIEF DESCRIPTION OF THE DRAWINGS

Embodiments of the invention are shown in the drawing and will be explained in further detail in the subsequent description.

DETAILED DESCRIPTION OF THE PREFERRED EMBODIMENTS

Figure 1:
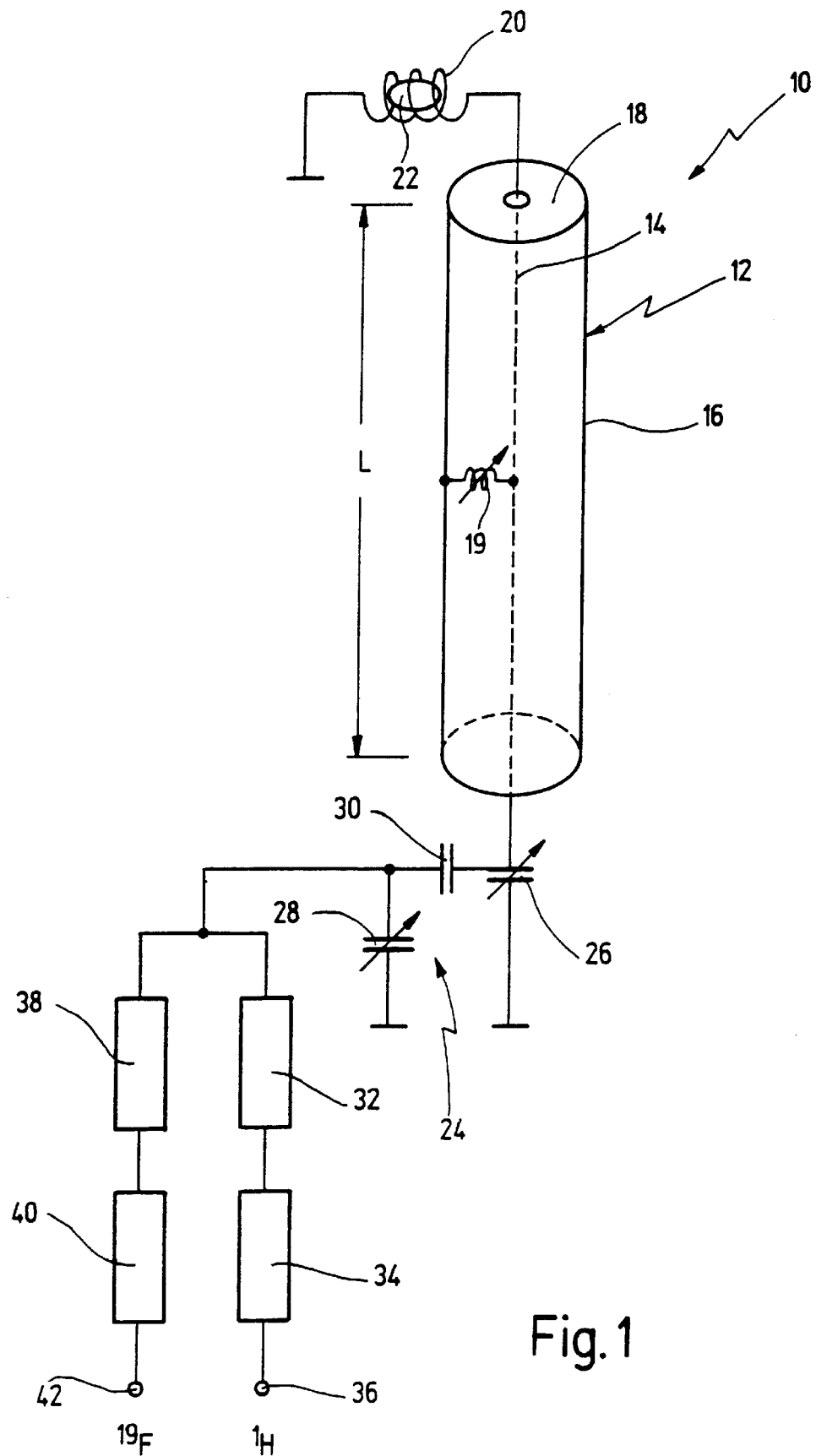
FIG. 1 shows a highly schematic depiction of a first embodiment of a probehead according to the present invention.

In FIG. 1 reference numeral 10 as a whole designates a probehead for nuclear magnetic resonance measurements. The other components of a nuclear magnetic resonance spectrometer, in particular the magnet system used as well as the electronic circuitry for transmitting and receiving, respectively, measuring signals, are generally known to the person of ordinary skill and are, hence, not shown for the sake of simplicity.

Probehead 10 comprises a piece of radio frequency transmission line 12, being preferably configured as a coaxial transmission line with an inner conductor 14 and an outer conductor 16.

The radio frequency transmission line, i.e. the piece of transmission line 12, has a length L. At about half the length an adjustable tuning inductor 19 interconnects inner conductor 14 and outer conductor 16 at the voltage node of the signal having a frequency $f_H$ that will be defined further below.

The upper end of a transmission line 12 in FIG. 1 is connected to a measuring coil 20 receiving a nuclear magnetic resonance sample 22 to be investigated. In the embodiment of FIG. 1, the opposite end of measuring coil 20 is connected to ground.

In FIG. 1 the lower end of a transmission line 12 is connected to a capacitive voltage divider 24. For that purpose, inner conductor 14 is connected to ground via an adjustable tuning capacitor 26. The electrode of tuning capacitor 26 opposite to ground is connected to an adjustable matching capacitor 28 via a coupling capacitor 30. The opposite electrode of matching capacitor 28 is also connected to ground.

The node between matching capacitor 28 and coupling capacitor 30 is connected to two branches. A first branch extends via a first bandpass filter 32 and a first band stop filter 34 to a first terminal 36, whereas the second branch likewise extends via a second bandpass filter 38 and a second band stop filter 40 to a second terminal 42.

First band pass filter 32 is tuned to a frequency $f_H$. First band stop filter 34, however, is tuned to a frequency $f_F$. Vice versa, second bandpass filter 38 passes frequency $f_F$ whereas second band stop filter 40 stops frequency $f_H$. By doing so, an interference between the two branches is avoided.

For the following consideration it should be assumed that a signal of frequency $f_F$ for measuring protons $^1H$ may be fed to first terminal 36, whereas a signal of frequency $f_F$ for a second kind of nuclei ($^{19}F$) may be fed to second terminal 42. At a measuring field strength of 9,4 T, $f_H$ is 400 MHz and $f_F$ is 376,308 MHz. The two frequencies, hence, only distinguish by about 6%.

Via capacitive voltage divider 24, the two signals are fed to transmission line 12. Matching capacitor 28 insofar helps to match both frequencies $f_H$ and $f_F$ to the characteristic impedance of the feeding line. Tuning capacitor 26 helps to tune to first frequency $f_H$, however, shifts second frequency $f_F$. If tuning capacitor 26 is adjusted, a tuning on $f_F$ may still be effected through adjustable tuning inductor 19 which, in turn, has no major impact on $f_H$.

When elements 16, 19 and 28 have been properly set in a way and in a sequence as described before, a tuning of the two frequencies $f_H$ and $f_F$ to the characteristic impedance of the feeding line is possible. If in that situation a measurement would be conducted utilizing a wobbler with a measuring bridge connected thereto, one could see two sharp negative peaks at 376,3 MHz and 400 MHz, corresponding to the two frequencies $f_F$ and $f_H$.

The overcritical coupling between transmission line 12 and measuring coil 20 is essentially achieved empirically. If, for example, measuring coil 20 is dimensioned for $f_H$=400 MHz, one would conventionally configurate a coil having between 5 and 7 windings and a diameter of about 5 mm.

The length L of transmission line 12 is now empirically determined by starting from a $\lambda/2$ transmission line. For 400 MHz $\lambda/2$ in a vacuum is about 38 cm. However, the (dielectric) supports of inner conductor 14 relative to outer conductor 16, that are needed in practice, and unavoidable stray capacitances, in particular at the ends of the transmission line, as well as the capacitive coupling and tuning effectively reduce the length L of transmission line 12 so that, empirically, the effective length L of transmission line 12 will be of the order of between 22 and 25 cm only.

Tuning inductor 19 will be of the order of several nH.

With the probehead 10 shown in FIG. 1, measurements may, therefore, be conducted on the system $^1H/^{19}F$, while utilizing almost the entire signal power that is fed to probehead 10, to be dissipated within measuring coil 20.

The procedure described above does, of course, not only apply to the case where a measuring signal is inputted to probehead 10. Instead, it also applies for the inverse case where a resonance signal from sample 22 is received in measuring coil 20 and outputted from probehead 10.

Whereas FIG. 1 shows the case of a so-called distant feed, distant tuning and distant matching, because all of the corresponding elements are located at the end of radio frequency transmission line 12 opposite measuring coil 20, FIG. 12 shows another embodiment where the coupling is effected on the same side of transmission line 12 to which measuring coil 20 is coupled, too. For the sake of simplicity only one channel for one measuring frequency is shown.

Figure 2:
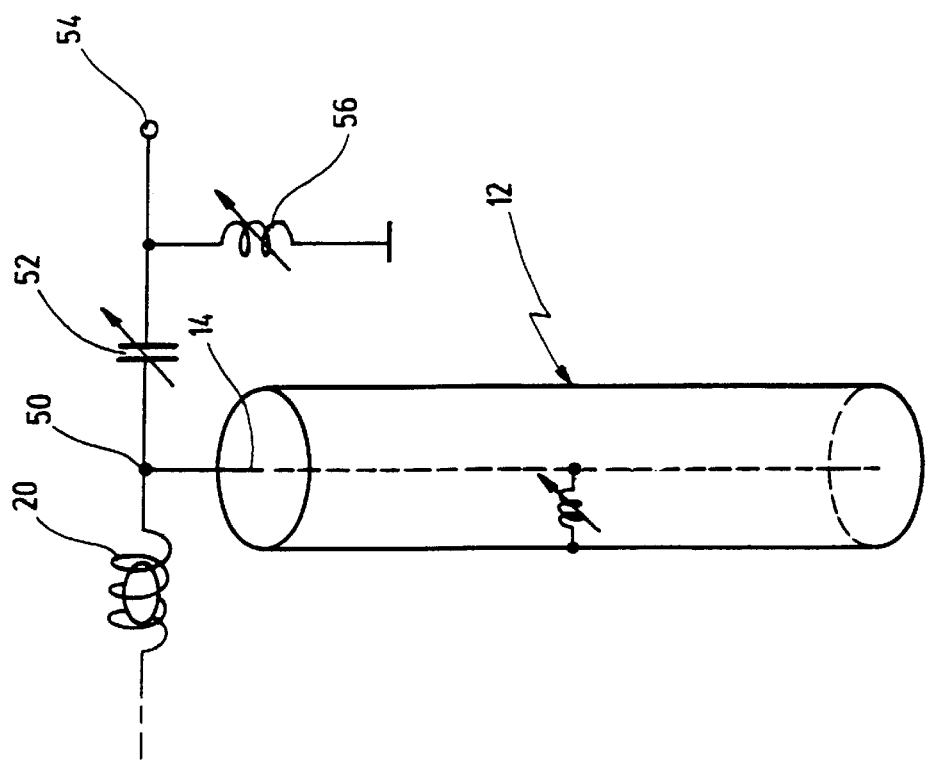
FIG. 2 shows a modification of the probehead of FIG. 1 for what concerns feeding signals for the first and/or the second kind of nuclei.

FIG. 2 shows a node 50 at the upper end of transmission line 12. Node 50 is not only connected to measuring coil 20 but also to a third terminal 54 via a tunable capacitor 52. Third terminal 54, in turn, is connected to ground via an adjustable inductor 56.

Figure 3:
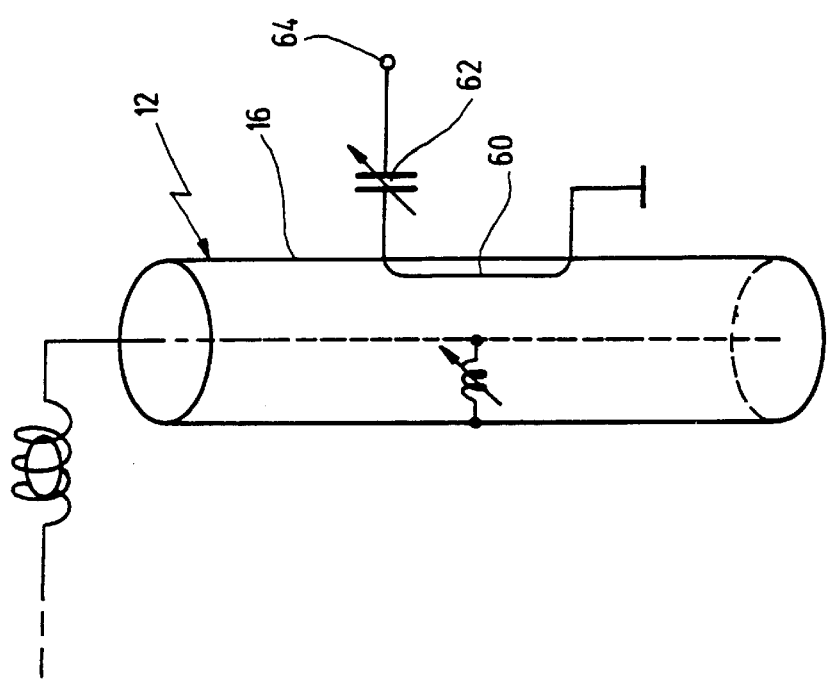
FIG. 3 shows a modification of the embodiment of FIG. 2.

As still another modification, FIG. 3 shows an inductive coupling in the area of about half the length of transmission line 12. For that purpose a coupling loop 60 is guided through outer conductor 16. Coupling loop 60 at its lower end in FIG. 3 is connected to ground, whereas its upper end is connected to a fourth terminal 64 via an adjustable capacitor 62.

The options for effecting a coupling in the embodiments of FIGS. 2 and 3 are known per se. Details may be taken from U.S. Pat. No. 5,229,724, mentioned at the outset.

Figure 4:
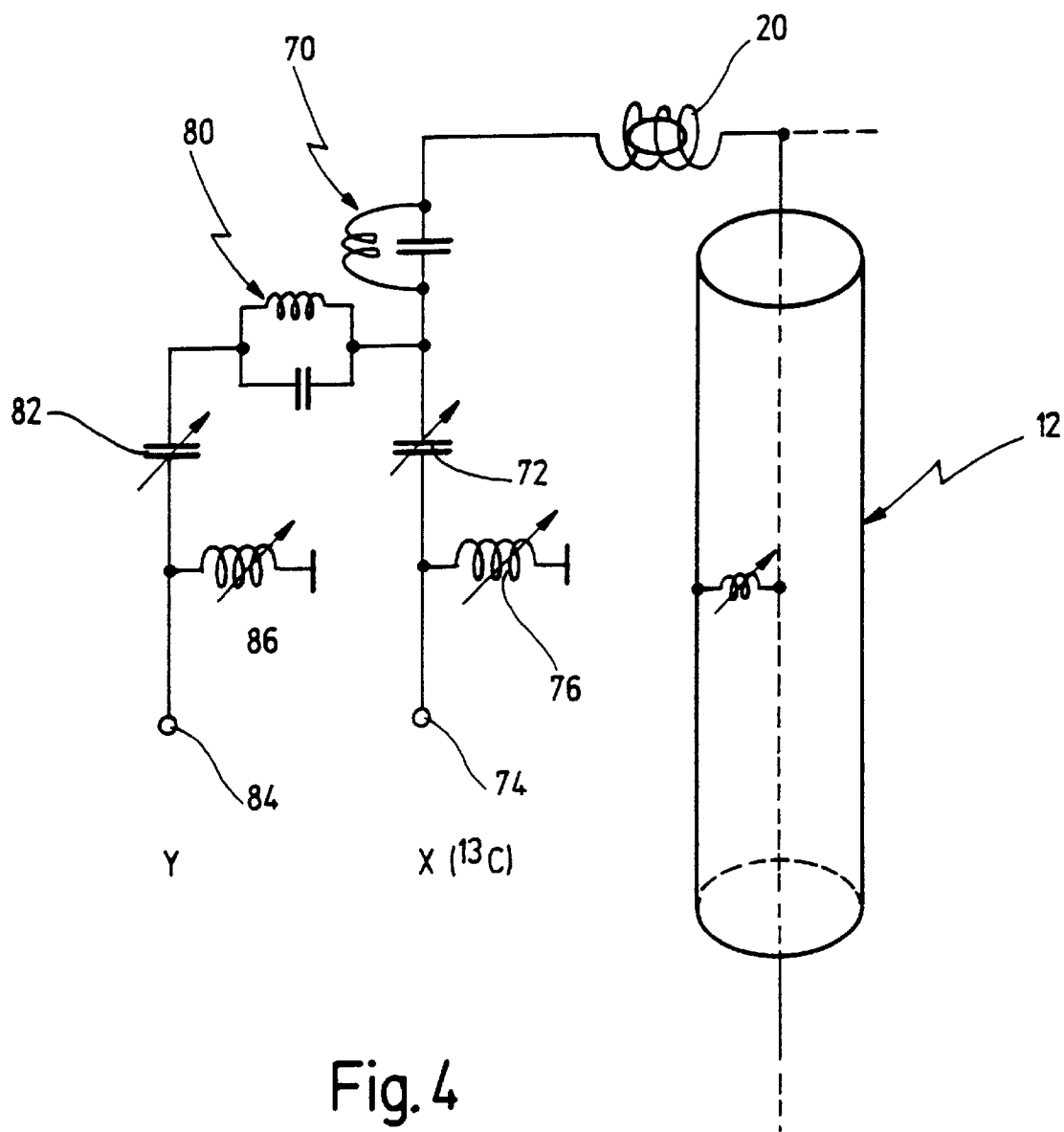
FIG. 4 shows still another embodiment opening the possibility to feed signals for other kinds of nuclei having highly distinct measuring frequencies.

Finally, FIG. 4 shows still another embodiment of the invention in which it is additionally possible to irradiate so-called X-frequencies and to receive same, respectively. The term "X-frequency" is to be understood to mean such signal frequencies, distinguishing at least by a factor of two from the measuring frequency. As an example, the case of $^{13}$C may be contemplated, having a measuring frequency of 100,577 MHz at a magnetic field strength of 9,4 T being, hence, only about a quarter of the $^1$H measuring frequency. The same holds true for other similar frequencies, indicated in FIG. 4 by Y.

In order to irradiate and to receive, respectively, signals of such frequencies, measuring coil 20 is connected with two branches via a third band stop filter 70 at the end opposite transmission line 12. The first branch extends to a fifth terminal 74 via a tunable capacitor 72. Fifth terminal 74 is connected to ground via a tunable inductor 76.

The second branch extends to a tunable capacitor 82 via a fourth band stop filter 80. Capacitor 82 is connected to a sixth terminal 84 which, in turn, is connected to ground via a tunable inductor 86.

Third band stop filter 70 is, approximately, tuned to the center frequency between $f_F$ and $f_H$, in order to exclude interferences between the signal branches of the first and the second kind of nuclei. Fourth band stop filter 80, in contrast, is tuned to the frequency of the X-branch (terminal 74), to ensure that branch X of FIG. 4 is independent from branch Y.

Various experiments have been conducted with a probehead 10 corresponding to the present invention. One can, for example, measure $^{13}$C and decouple at $^{19}$F, or one may measure at $^{13}$C and decouple at $^1$H, moreover, it is possible to measure at $^{13}$C and decouple simultaneously at $^1$H and at $^{19}$F. This shows that the two channels (FIG. 1) or the three or four channels (FIGS. 1 and 4) may be utilized in any arbitrary combination.

Still another impressive application where the present invention is the measurement of perfluoric nonanic acid at 400 MHz for $^1$H and at about 376 MHz for $^{19}$F. With such measurement the so-called $^{19}$F-Bloch-Siegert-shift may be measured while simultaneously decoupling at $^1$H. With conventional probeheads only a relatively small decoupling field for $^1$H may be irradiated. With a sample of 4 mm diameter in a conventional MAS-probehead of 13 kHz rotational frequency, an amplitude of the $^1$H decoupling field of a maximum of 100 kHz may be achieved in such a conventional measurement. This results in a $^{19}$F line shift of about only 200 Hz.

If, however, a probehead according to the present invention is used, the amplitude of the $^1$H decoupling field is increased to above 160 kHz, corresponding to a line shift of about 550 Hz at the same transmission power.

This, too, shows that a probehead according to the present invention makes it possible to achieve measuring results that have not been possible before.

What is claimed is:

1. A probehead for nuclear magnetic resonance measurements, in which at least a first and a second distinct kind nuclei are excited in a magnetic field, comprising:
    a) a measuring coil cooperating with a sample and being connected to
       a first terminal for feeding a signal of a first frequency for exciting said first kind of nuclei and/or for receiving a resonance signal emitted by nuclei of said first kind of nuclei; and
       a second terminal for feeding a signal of a second frequency for exciting said second kind of nuclei and/or for receiving a resonance signal emitted by nuclei of said second kind of nuclei;
    b) a radio frequency transmission line of predetermined length connected to said measuring coil, said transmission line being bridged at about half of said length by a resonance element, wherein the coupling between said measuring coil, said radio frequency transmission line and said resonance element is set to be overcritical, such that a transmission characteristic of said measuring coil has two maxima with frequencies corresponding to said first and to said second frequency.

2. The probehead of claim 1, characterized in that said first and said second frequencies distinguish by less than 10%.

3. The probehead of claim 2, wherein said kinds of nuclei are $^1$H and $^{19}$F.

4. The probehead of claim 2, wherein said kinds of nuclei are $^{31}$P and $^7$Li.

5. The probehead of claim 2, wherein said kinds of nuclei are $^{23}$Na and $^{13}$C.

6. The probehead of claim 1, wherein said resonance element is configured as an adjustable inductor.

7. The probehead of claim 1, wherein said radio frequency transmission line is configured as a coaxial line having an inner conductor and an outer conductor, said resonance element interconnecting said inner conductor and said outer conductor.

8. The probehead of claim 1, wherein said measuring coil is connected to a first end of said radio frequency transmission line, said first and said second terminals being positioned at a second end of said radio frequency transmission line opposite said first end.

9. The probehead of claim 8, wherein said terminals are capacitively connected to said radio frequency transmission line.

10. The probehead of claim 9, wherein said terminals are connected to said radio frequency transmission line via a capactive voltage divider.

11. The probehead of claim 10, wherein said capacitive voltage divider comprises a tuning capacitor arranged between said radio frequency transmission line and ground, a coupling capacitor extending from an electrode of said tuning capacitor opposite ground, and a matching capacitor connecting said coupling capacitor and ground, said terminals being connected to a node between said coupling capacitor and said matching capacitor.

12. The probehead of claim 1, wherein said measuring coil is connected to an end of said radio frequency transmission line, said first and said second terminals being positioned at said end of said radio frequency transmission line.

13. The probehead of claim 12, wherein said terminals are capacitively connected to said radio frequency transmission line.

14. The probehead of claim 13, wherein said terminals are connected to said radio frequency transmission line via a capactive voltage divider.

15. The probehead of claim 14, wherein said capacitive voltage divider comprises a tuning capacitor arranged between said radio frequency transmission line and ground, a coupling capacitor extending from an electrode of said tuning capacitor opposite ground, and a matching capacitor connecting said coupling capacitor and ground, said terminals being connected to a node between said coupling capacitor and said matching capacitor.

16. The probehead of claim 1, wherein said measuring coil is connected to an end of said radio frequency transmission line, said terminals being positioned at one half of said length.

17. The probehead of claim 16, wherein said terminals are inductively connected to said radio frequency transmission line.

18. The probehead of claim 1, wherein said measuring coil is, further, connected to still another terminal for feeding a signal of a third frequency for exciting a third kind of nuclei and/or for receiving signals emitted from nuclei of said third kind of nuclei.

19. The probehead of claim 18, wherein said other terminal is positioned at an electrode of said measuring coil opposite said radio frequency line.

20. The probehead of claim 18, wherein said third frequency distinguishes from said first and from said second frequency by at least a factor of two.

21. The probehead of claim 20, wherein said other terminal is positioned at an electrode of said measuring coil opposite said radio frequency line.

* * * * *